United States Patent
Tang et al.

(10) Patent No.: US 9,373,995 B2
(45) Date of Patent: Jun. 21, 2016

(54) BASIC FUNCTION UNIT OF VOLTAGE-SOURCE CONVERTER BASED ON FULL-CONTROLLED DEVICES

(75) Inventors: Guangfu Tang, Beijing (CN); Zhiyuan He, Beijing (CN); Hongzhou Luan, Beijing (CN); Qiang Li, Beijing (CN); Yunpeng Li, Beijing (CN)

(73) Assignees: CHINA ELECTRIC POWER RESEARCH INSTITUTE, Beijing (CN); STATE GRID CORPORATION OF CHINA, Beijing (CN)

( * ) Notice: Subject to any disclaimer, the term of this patent is extended or adjusted under 35 U.S.C. 154(b) by 373 days.

(21) Appl. No.: 13/982,274

(22) PCT Filed: Oct. 31, 2011

(86) PCT No.: PCT/CN2011/001816
§ 371 (c)(1),
(2), (4) Date: Jul. 29, 2013

(87) PCT Pub. No.: WO2012/100398
PCT Pub. Date: Aug. 2, 2012

(65) Prior Publication Data
US 2013/0314956 A1    Nov. 28, 2013

(30) Foreign Application Priority Data
Jan. 28, 2011    (CN) .......................... 2011 1 0030469

(51) Int. Cl.
*B23K 11/24*    (2006.01)
*H02M 1/32*    (2007.01)
(Continued)

(52) U.S. Cl.
CPC ................ *H02M 1/32* (2013.01); *H02M 7/003* (2013.01); *H01L 2924/0002* (2013.01); *H02M 2007/4835* (2013.01)

(58) Field of Classification Search
CPC ............... H02J 1/00; H02J 4/00; H02J 17/00; H02J 1/10; H02J 2003/007; H02J 3/00; H02J 3/14; H02J 3/24; H02J 3/382; H02J 7/0042; H02J 7/0052; H02J 9/062; H02J 13/00; H02J 13/0003; H02J 13/0013
USPC .......................................................... 307/112
See application file for complete search history.

(56) References Cited

U.S. PATENT DOCUMENTS 5,980,095 A * 11/1999 Asplund ................... H02J 3/36
                                                                 700/286
2004/0027762 A1* 2/2004 Ohi ....................... H03K 17/168
                                                                 361/100

(Continued)

*Primary Examiner* — Jared Fureman
*Assistant Examiner* — Esayas Yeshaw
(74) *Attorney, Agent, or Firm* — Platinum Intellectual Property LLP (57) ABSTRACT

The present invention relates to a basic function unit of voltage source converter, which is characterized in that the basic function unit includes a switching device function module, a by-pass function module, a switch protection function module, a secondary control and protection function module, and a energy storage unit. The secondary control and protection function module, the energy storage unit and the by-pass function module are all fixed on the motherboard, there is a slide rail at the bottom of the motherboard, the motherboard can move back and forth on the slide rail. The voltage source converter based on that unit is highly modular, insensitive to switch device parameters, lower output voltage change rate, and smaller dv/dt stress of equipment, smaller noise, without filter, convenient installation and maintenance.

10 Claims, 4 Drawing Sheets

(51) Int. Cl.
*H02M 7/00* (2006.01)
*H02M 7/483* (2007.01)

(56) References Cited

U.S. PATENT DOCUMENTS

| | | | |
|---|---|---|---|
| 2004/0052023 A1* | 3/2004 | Asplund | H02H 7/1222 361/91.1 |
| 2004/0257845 A1* | 12/2004 | Wu | H03K 17/107 363/132 |
| 2005/0012395 A1* | 1/2005 | Eckroad | H02J 3/16 307/44 |
| 2005/0204761 A1* | 9/2005 | Karikomi | G01K 7/425 62/228.1 |
| 2007/0296383 A1* | 12/2007 | Xu | H02M 1/14 323/282 |
| 2009/0174353 A1* | 7/2009 | Nakamura | B60L 11/1868 318/400.27 |
| 2009/0231811 A1* | 9/2009 | Tokuyama | H01L 23/36 361/699 |
| 2011/0272042 A1* | 11/2011 | Wei | H01L 25/16 137/339 |

* cited by examiner

BASIC FUNCTION UNIT OF VOLTAGE-SOURCE CONVERTER BASED ON FULL-CONTROLLED DEVICES

RELATED APPLICATIONS

This application is a United States National Stage Application filed under 35 U.S.C 371 of PCT Patent Application Serial No. PCT/CN2011/001816, filed Oct. 31, 2011, which claims the benefit of Chinese Patent Application Serial No. 201110030469.6, filed on Jan. 28, 2011, the disclosure of all of which are hereby incorporated by reference in their entirety.

FIELD OF THE INVENTION

The invention relates to a power transmission system of AC/DC conversion and power control device based on full-controlled-devices, in particular, it relates to the basic function unit of AC-DC conversion and power control based on IGBT (Insulated Gate Bipolar Transistor) devices applied for DC transmission system.

BACKGROUND OF THE INVENTION

With the performance improvement of the power semiconductor switching devices, the power electric devices also developed from widely used half controlled power semiconductor switch, thyristor, to present excellent full controlled devices, so as to drive the rapid development of power electronic converter technology, and kinds of converters appeared based on pulse width modulation (PWM) control.

Voltage source converter (voltage source converter VSC) technology is a type new converter technology based on turn-off device IGBT (insulated gate bipolar transistor) and pulse width modulation (PWM) technology. Because IGBT is able to turn-off itself, the flexible HVDC system can work in the passive inverter mode, no need of additional commutation voltage, and the end can be a passive network; VSC can simultaneously and independently control the active power and wattless power, it is flexible and convenient to control; VSC did not need wattless power supply at the AC side, but also play the role of STATCOM to dynamically compensate AC bus wattless power and stable AC voltage; there is no communication need between VSC station, and easy to constitute a multi-terminal system.

Conventional HVDC thyristor valve has been widely used in power system. It has obvious advantages at the high voltage long distance transmission and the interconnection of large area power grid. Owing to the switch device turn-off control limits, the valve thyristor is prone to commutation failure, it cannot be used for weak AC system interconnection. And all the voltage source converters based on full-controlled-devices are able to self turn-off without additional commutation voltage, and the end can be a passive network; they have active power and wattless power fast independent control ability and wattless power dynamic compensation ability, can provide reactive power and voltage support for the system on the emergency situations; there is no communication need and it can realize the unattended, that is contribute to the construction of smart grid.

At present, the transmission projects in operation based on the voltage source converter are all adopted two or three level converter structure, but this structure has some problems:

(1) two level voltage source converter adopts pulse width modulation technology, the output voltage of the converter is high frequency jump, which brings about a series of problems like high dv/dt stress of equipment, high system loss, high noise and hardly electromagnetic environment. Even if the three level voltage source converter adopted, it just can alleviate the problem to some extent only.

(2) two level and three level voltage source converter uses switches series technique, because of the switching devices parameters dispersion, each switching device needs to design a complex static voltage balancing circuit, a dynamic voltage balancing circuit and a snubbed circuit, that causes potential problems to the valve during operation. In addition, the switching devices series technique require high performance switches, that needs very high pressing process, it is difficult to manufacture parts, and it is easy to come out assembly defects.

(3) the output voltage waveform of two level and three level voltage source converter has high distortion rate, high harmonic content, so it needs to design the filter circuit to reduce the adverse effects caused by harmonics on the system.

1. slide rail; 2. capacitor; 3. bypass switch; 4. switch to protect thyristor valve; 5. IGBT control board box; 6. motherboard; 7. power pack; 8. main control box; 9. thyristor valve and switch control board box; 10. water pipe; 11. IGBT control board box; 13. IGBT control board; 14. radiator; 15. IGBT; 16. IGBT bursting diaphragm; 17. waterproof cover board;

SUMMARY OF THE INVENTION

The aim of the present invention is to provide a novel voltage source converter basic function unit, voltage source converter based on that unit is highly modular, insensitive to switch device parameters, lower output voltage change rate, smaller dv/dt stress of equipment, smaller noise, without filter, convenient installation and maintenance.

The present invention employs commercial Insulated Gate Bipolar Transistor (IGBT), including a primary circuit, the secondary controller protection, cooling unit and shielding unit, these in order are integrated together and form a minimum complete functional voltage source converter unit, and then these functional units are orderly linked to form a voltage source converter which is suitable for different voltage and power levels.

To achieve above aims, this present invention adopts following technical scheme:

The present invention provides a voltage source converter basic function unit, the improvement is that the functional unit includes a switching device function module, a by-pass function module, a switch protection function module, a secondary control and protection function module, and a energy storage unit; Said the secondary control and protection function module, the energy storage unit and the by-pass function module are all fixed on the motherboard, there is a slide rail at the bottom of the motherboard, the motherboard can move back and forth on the slide rail.

Wherein said switching device function module is a IGBT switch, said by-pass function module is primary by-pass switch, said switch protection function module is the thyristor valve switch used for protecting the IGBT switch, said thyristor valve switch used for protecting IGBT switch is connected with the by-pass switch through electrics.

Wherein said secondary control and protection function module includes IGBT control board, middle control board and power, at the exterior of said IGBT control board, middle control board and power are all fixed one shielding box to form the IGBT control board box, middle control box and power pack, said power pack is connected with motherboard, said middle control box and said IGBT control board box are located at the top of said power pack.

Wherein there are two IGBT control boards inside said IGBT control board box, and the IGBT control board box is connected with the radiator below it through the bolt; the number of the radiator is same to that of the IGBT control board, and there are two IGBTs between two radiators, the two IGBTs are face to face; at the sides of the IGBTs are fixed IGBT bursting diaphragms, so do the radiators.

Wherein said by-pass switch adopts rapid switch, its action time is less 3 ms or equal 3 ms.

Wherein said secondary control and protection module includes a power supply unit, a drive unit and central logic control unit, said power supply unit is located in the power pack, said central logic control unit is located in the middle control board box, and each unit is mutually independent; said drive unit is fixed at the outside of the IGBT and the radiator.

Wherein energy storage unit is a capacitor, and it is a DC capacitor, separate from other devices relatively.

Wherein the basic function unit water cooling system includes the radiator and water pipe to cool the IGBT, one end of the water pipe is connected with the IGBT radiator, and anther end is connected with the water supply.

Wherein said by-pass function module also contains by-pass switch drive, and said switch device protection function module contains thyrsitor drive, that drives are both installed in the same board box to form a thyristor valve and switch control board box, and integrated onto one card.

The key equipment of the voltage source converter basic function unit provided by the present invention is the switch function module. It is the basis of AC/DC transform. Each basic function unit includes two IGBT, each IGBT is installed on a water-cooled radiator, and an equalizing resistance is installed on one of them.

The radiator takes the heat which is produced during equalizing resistance and IGBT breaking and conducting operation, so as to avoid switch devices damage and even explosion due to excessive junction temperature. The equalizing resistance is used for equalizing voltage on sub module by basic function unit cascade connection, so as to avoid sub module damage by nonuniform of sub module partial voltage. In addition, IGBT bursting diaphragms are located outside the IGBT to reduce the impact caused by the explosion of the switch device; and the top bursting diaphragm is a water leakage proof device used for prevent sub module to leak water and to impact the key device IGBT and other drive subsidiary-adapter circuit.

By-pass function module is a primary by-pass switch, the by-pass switch adopts fast switch, its action time is less 3 ms or equal 3 ms. When unit fault happens, it can be quickly cut off the fault unit in order to avoid the collapse of the system.

The switch protection function module adopts thyristor switch. The thyristor is connected with the switch device by electrics. When fail happens, that is capable of conducting the fault current to protect the IGBT switch.

The basic function unit is water cooling system, which comprises a radiator and a connection pipe (an IGBT is connected with the radiator to cooling the IGBT, and also as the IGBT bursting diaphragm, one end of the connection pipe is connected with the radiator and another end is connected with external mains water pipe to supply cooling liquid.), the outside of the connection pipe is composed of a water inlet pipe and a return pipe.

In addition, the basic function unit also includes equalizing loop, explosion-proof, cooling, water leakage proof, supporting structure and other auxiliary components; full control device IGBT is the core equipment of the basic function unit, is the basis of AC/DC transform.

The role of each component is described as below:

Each basic function of each unit consists of two IGBTs, each IGBT is installed on a radiator, the radiator takes the high heat IGBT and other devices generated in operation so as to avoid switch devices damage and even explosion due to excessive junction temperature.

The equalizing circuit is to equalize the basic function unit voltage when basic function unit cascade avoid equipment damage due to the unbalanced-voltage-division.

In addition, the periphery of the switch devices are added explosion-proof layer to reduce the impact of switch devices explosion; the top layer also have water leakage prevention function, used to prevent sub module water leakage and impact the key device IGBT and its driver circuits.

The by-pass function module adopts a special fast switch, its action time is less than 3 ms or equal 3 ms, and it is connection with the switching device function blocks in parallel; During a plurality of basic function unit cascaded into the converter and work, a basic function unit failure happens, the by-pass function module is used for passing by the basic function of fault unit rapidly, to avoid impact no-fault basic functions units and accident expansion.

The switch protection function module is also connected with the by-pass function module in parallel, for the voltage source converter cascaded by a plurality of basic function units, when system fault, the fault current will cause the switch device junction temperature rise quickly and burned, this function module is designed for sharing fault current, so as to avoid the equipment damage.

The secondary control protection function modules are arranged in a plurality of shielding boxes, and it effectively reduces the impact of external adverse electromagnetic environment on the secondary control card; the secondary control protection system includes a power supply unit, a drive unit and a central logic control unit, each unit can be independently disassemble, that is convenient to debug, maintenance and replace.

The basic function unit does not use external power supply, the power is supplied by the energy storage unit by which high voltage can be change into different voltage through the special conditioning circuit supplied for IGBT drive, thyristor drive and vacuum switch drive and other drive, it is close to the energy storage unit to reduce affect region of the high energy wire to the minimum.

The IGBT driver is fixed on the periphery of the IGBT and radiator function module, the thyristor drive and vacuum switch drive are installed next the thyristor and the vacuum switch, to ensure distance between the equipment and drive is nearest, to reduce primary strong electromagnetic environment impact so as to enhance the reliability of the driving signal.

The central logic control unit is used to coordinate the secondary control and protection system, and interface with the upper control bus system to control the open and shutdown of the IGBT, the thyristor and the by-pass switches, and protect the unit and the system; all the cards of the secondary control and protection system communicates through the optical fiber, to avoid the influence of complex electromagnetic environment of the functional unit, and improve the reliability of control and protection.

The energy storage unit adopts the energy storage devices that can resist non-sinusoidal current chronically, and the inductance of the device itself is relatively small.

The peripheral interface of the water cooling system of the basic function unit is only composed of one water inlet pipe and one return pipe, so the unit uses the least external tap joints; the switch devices adopts external cooling mode, cooling water only flows through pipe and radiator, not through primary loop, which greatly reduces the influence of water leakage probability and electric corrosion.

All equipment of the basic function unit are fixed on the supporting plate, there is a slide rail at the bottom of the plate, it is convenient to maintenance, repair and replace the single basic function unit when the voltage source converter is required.

The main technical characteristics of sub modules:
(1) It is electrical a system, and the smallest VSC functional unit, easy to electrical extend.
(2) It is independent structure; one sub module is a complete VSC basic function unit, it is convenient cascade expansion.
(3) It adopts the compact design; the primary electrical device, structure, cooling system and secondary control and protection systems are integrated in a limited space.
(4) Sub module has a self-contained power supply; it ensures the energy demand under the continuous trigger conditions;
(5) The primary loop and the secondary cards are physically isolated from each other; it reduces the primary loop strong electromagnetic environment interference to the secondary units.

Compared with the prior art, a voltage source converter basic function unit based on full-controlled-devices provided by the present invention has the following advantages:
1. The basic function unit is a electrical system, it has the voltage source converter function completely, it is easy to electrical extend.
2. The basic function unit is independent structure, convenient cascade expansion, the number of cascade can be adjusted flexible according to the voltage level and power level;
3. The basic function unit adopts function zoning design; it is clear to read, each functional area can be independently disassemble, it is convenient to installate and maintenance;
4. The basic function unit adopts the compact design, the primary electrical device, structure, cooling system and secondary control and protection systems are integrated in a limited space.
5. The basic function unit has has a self-contained power supply; it ensures the energy demand under the continuous trigger conditions;
6. The primary loop and the secondary cards are physically isolated from each other; it reduces the primary loop strong electromagnetic environment interference to the secondary units.

7. The basic function unit realized the fire proof, explosion proof, water proof, anti-interference design, it has high reliable;
8. The basic function unit realized modularization authentically, it can realize large-scale production, benefit to shorten the construction period.

DETAILED DESCRIPTION OF EMBODIMENTS

The detail of the embodiments is described as below incorporated with the figures by way of cross-reference for a voltage source converter basic function unit based on full-controlled-devices provided by the present invention.

The voltage source converter basic function unit includes a switching device function module, a by-pass function module, a switch protection function module, a secondary control and protection function module, and a energy storage unit. The secondary control and protection function module, the energy storage unit and the by-pass function module are all fixed on the motherboard 6, there is a slide rail 1 at the bottom of the motherboard 6, the motherboard 6 can move back and forth on the slide rail 1. All equipment of the basic function unit are fixed on the supporting plate, there is a slide rail at the bottom of the plate, it is convenient to maintenance, repair and replace the single basic function unit when the voltage source converter is required.

Figure 1:
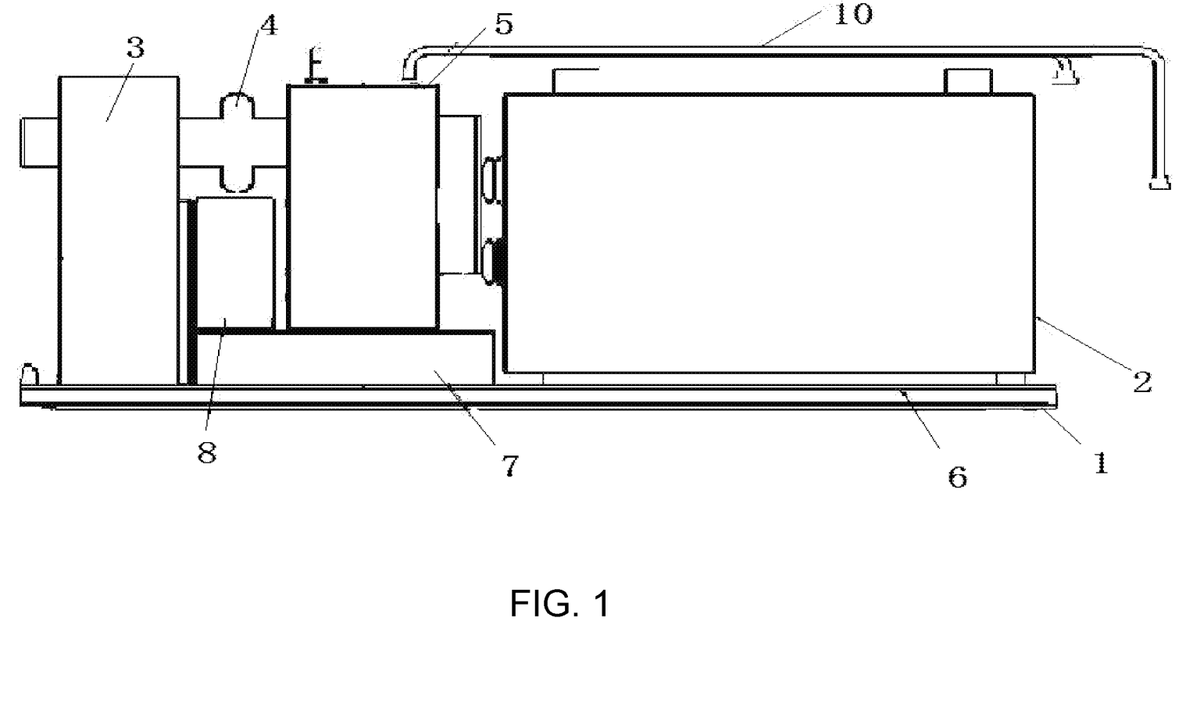
FIG. 1 is the schematic diagram of the VSC basic function unit (hereinafter referred to as sub module) of a voltage source converter basic function unit based on full-controlled-devices provided by the present invention.

As shown in FIG. 1, the by-pass function module is primary by-pass switch 3, the switch protection function module is the thyristor valve switch 4 used for protecting IGBT switch, the thyristor valve switch 4 is used for protecting IGBT switch is connected with the by-pass switch through electrics.

The secondary control and protection function module includes IGBT control board 13, main control board and power, at the exterior of the IGBT control board 13, main control board and power are all fixed one shielding box to form the IGBT control board box 11, main control box 8 and power pack 7, the power pack 7 is connected with the motherboard 6, main control box 8 and the IGBT control board box 5 are located at the top of said power pack 7.

There are two IGBT control boards 13 inside the IGBT control board box, and the IGBT control board box 11 is connected with the radiator 14 below it through the bolt; the number of the radiator 14 is same to that of the IGBT control board 13, and there are two IGBTs 15 between two radiators 14, the two IGBTs 15 are face to face; at the sides of the IGBTs 15 are fixed IGBT bursting diaphragms 16, so do the radiators.

The secondary control and protection module includes a power supply unit, a drive unit and central logic control unit, the power supply unit is located in the power pack, the central logic control unit is located in the main control board box 8, and each unit is mutually independent; the drive unit is fixed at the outside of the IGBT and the radiator 14.

The energy storage unit is a capacitor 2, and it adopts DC capacitor, separates from other devices relatively.

Figure 2:
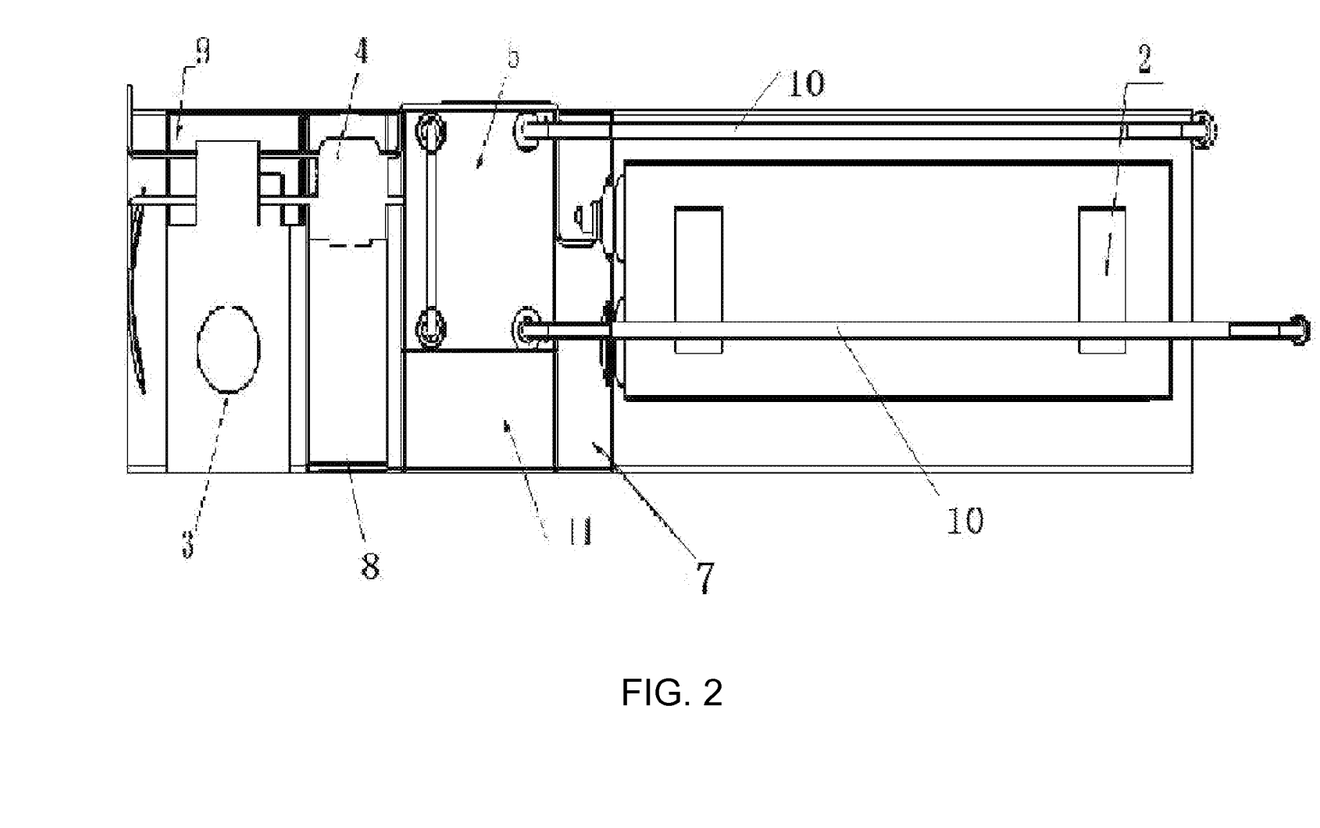
FIG. 2 is the vertical view of the VSC basic function unit of a voltage source converter basic function unit based on full-controlled-devices provided by the present invention.
Figure 3:
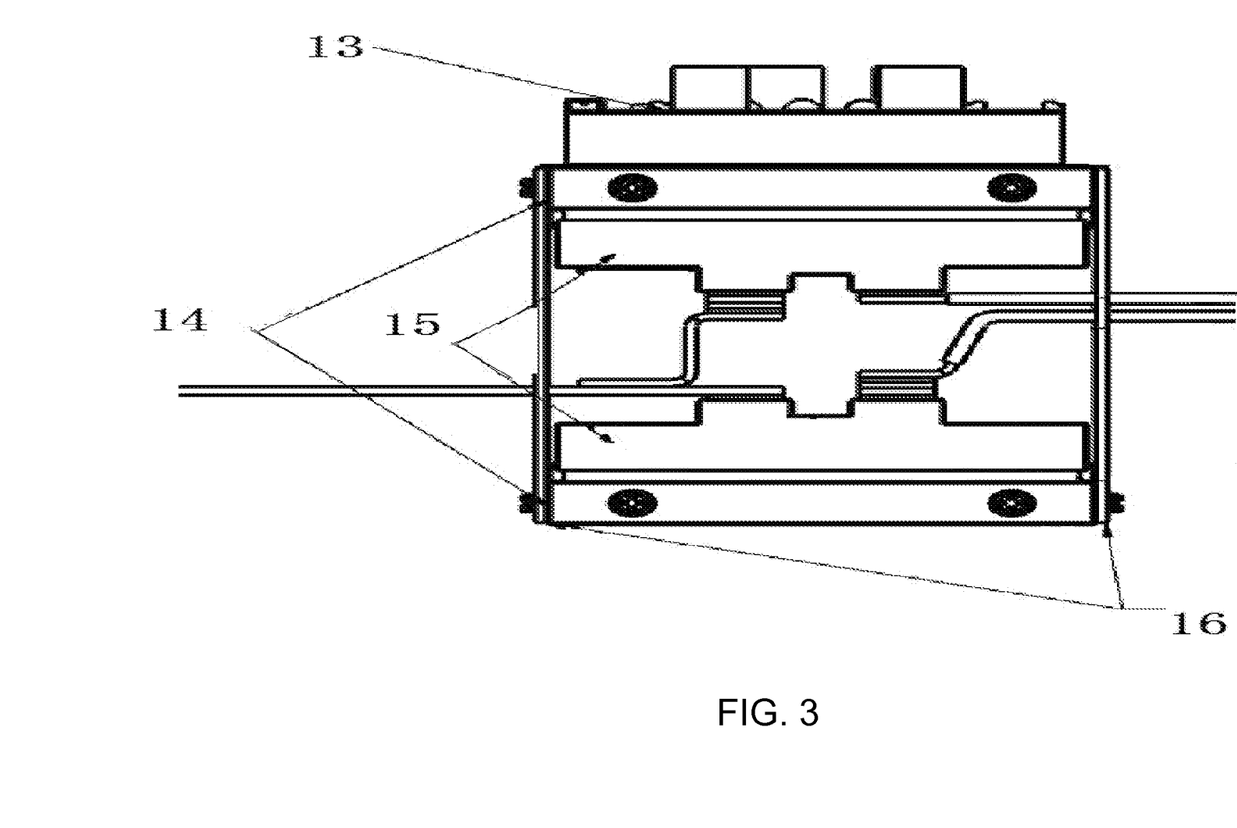
FIG. 3 is the front view of the VSC basic function unit of a voltage source converter basic function unit based on full-controlled-devices provided by the present invention.
Figure 4:
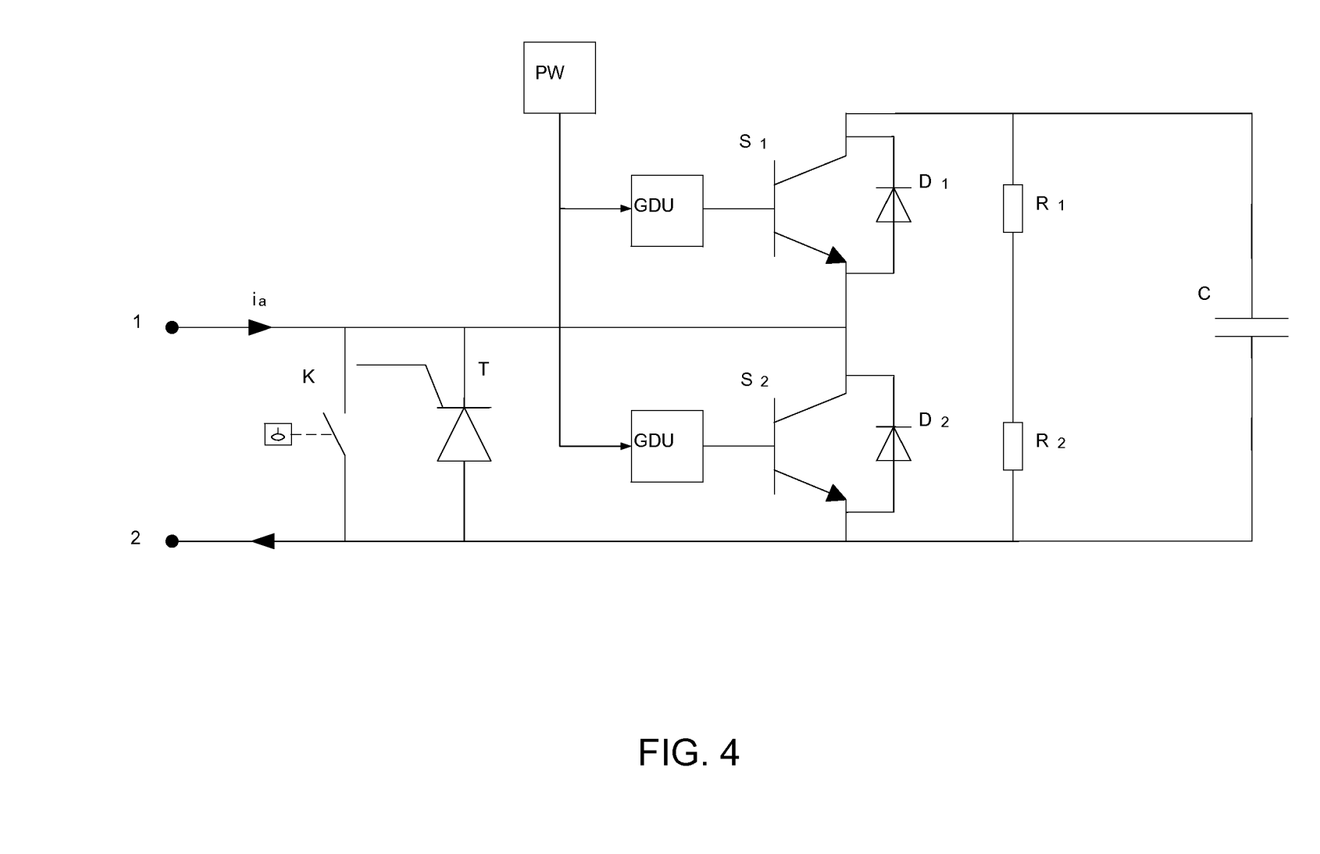
FIG. 4 is the left view of the VSC basic function unit of a voltage source converter basic function unit based on full-controlled-devices provided by the present invention.

As shown in FIG. 1-2, the basic function unit water cooling system includes the radiator and water pipe to cool the IGBT, one end of the water pipe is connected with the IGBT radiator, and anther end is connected with the water supply. There are four circle holes at the IGBT control board box. The water pipes pass through the two right holes and connected with IGBT radiator.

The by-pass function module contains by-pass switch drive, and the switch device protection function module contains thyrsitor drive, that drives are both installed in the same board box to form a thyristor valve and switch control board box, and integrated onto one card.

As shown in FIG. 1, the by-pass function module is primary by-pass switch 3, the switch protection function module is the thyristor valve switch 4 used for protecting IGBT switch, the thyristor valve switch 4 is used for protecting IGBT switch is connected with the by-pass switch through electrics.

The by-pass function module adopts a special fast switch, its action time is less than 3 ms, and it is connection with the switching device function blocks in parallel; During a plurality of basic function unit cascaded into the converter and work, when a basic function unit failure happens, the by-pass function module is used for passing by the basic function of fault unit rapidly, to avoid impact no-fault basic functions units and accident expansion.

Among them, IGBT is the core equipment of the basic functional unit, each basic function of each unit is composed of two IGBTs, and respectively arranged on each radiator, the radiator takes the heat which is produced during equalizing resistance and IGBT breaking and conducting operation, so as to avoid switch devices damage and even explosion due to excessive junction temperature.

The secondary control protection function modules are arranged in a plurality of shielding boxes, and it effectively reduces the impact of external adverse electromagnetic environment on the secondary control card; the secondary control protection system includes a power supply unit, a drive unit and a central logic control unit, each unit can be independently disassemble, that is convenient to debug, maintenance and replace.

The basic function unit does not use external power supply, the power is supplied by the energy storage unit by which high voltage can be change into different voltage through the special conditioning circuit supplied for IGBT drive, thyristor drive and vacuum switch drive and other drive, it is close to the energy storage unit to reduce affect region of the high energy wire to the minimum.

The IGBT driver is fixed on the periphery of the IGBT and radiator function module, the thyristor drive and vacuum switch drive are installed next the thyristor and the vacuum switch, to ensure distance between the equipment and drive is nearest, to reduce primary strong electromagnetic environment impact so as to enhance the reliability of the driving signal.

The energy storage unit adopts the energy storage devices that can resist non-sinusoidal current chronically, and the inductance of the device itself is relatively small. And equipment is arranged back of the unit back alone, relatively separate from other devices.

The peripheral interface of the cooling system of the basic function unit is only composed of one water inlet pipe and one outlet pipe, so the unit uses the least external tap joints. The switch devices adopts external cooling mode, cooling water only flows through pipe and radiator, not through primary loop, which greatly reduces the influence of water leakage probability and electric corrosion.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

What is claimed is:

1. A basic function unit of voltage-source converter, comprising:
    a switching device function module,
    a by-pass function module,
    a switch protection function module;
    a secondary control and protection function module housed in a shielding box operable to reduce electromagnetic interference on the secondary control and protection function module, the secondary control and protection function module including a central logic control unit operable to coordinate functions of the switching device function module, the by-pass function module, the switch protection function module and the secondary control and protection function module;
    an energy storage unit;
    a motherboard being adapted to install on a slide rail; and
    wherein the secondary control and protection function module, the energy storage unit and the by-pass function module are all fixed on the motherboard, and
    wherein the motherboard can move back and forth on the slide rail.

2. The basic function unit of voltage-source converter of claim 1, wherein the switching device function module is a IGBT switch, the by-pass function module is a primary by-pass switch, the switch protection function module is a thyristor valve switch used for protecting the IGBT switch, and wherein the thyristor valve switch for protecting the IGBT switch is connected with the primary by-pass switch through electrics.

3. The basic function unit of voltage-source converter of claim 1, wherein the secondary control and protection function module includes a IGBT control board, a middle control board and power, the IGBT control board, the middle control board and power each being fixed in shielding boxs to form the IGBT control board box, the middle control box and the power pack,
    wherein the power pack is connected with the motherboard, and
    wherein the middle control box and the IGBT control board box are located at the top of the power pack.

4. The basic function unit of voltage-source converter of claim 1, wherein there are two IGBT control boards inside the IGBT control board box, and the IGBT control board box is connected with a radiator below it through a bolt, wherein the number of the radiator is same to that of the IGBT control board, and there are two IGBT between the two radiators, the two IGBTs are face to face; at the both sides of the IGBTs are fixed IGBT bursting diaphragms, so do the radiators.

5. The basic function unit of voltage-source converter of claim 2, wherein the primary by-pass switch adopts rapid switch with action time less or equal to 3 ms.

6. The basic function unit of voltage-source converter of claim 1, wherein the secondary control and protection module includes a power supply unit, and a drive unit, the power supply unit being located in a power pack, the central logic control unit being located in a main control board box, and each unit is independent to each other; and
    wherein the drive unit is fixed at the outside of a IGBT control board and a radiator.

7. The basic function unit of voltage-source converter of claim 1, wherein the energy storage unit is a capacitor which is a DC capacitor being separate from other devices.

8. The basic function unit of voltage-source converter of claim 1, further comprising a water cooling system for the basic function unit of voltage-source converter, the water cooling system includes a IGBT radiator and a water pipe to cool a IGBT, wherein one end of the water pipe is connected with the IGBT radiator, and anther end is connected with a water supply.

9. The basic function unit of voltage-source converter of claim 1, wherein the by-pass function module includes a by-pass switch drive, and the switch device protection function module includes a thyrsitor drive, both drives being installed in a board box to form a thrysitor valve and a switch control board box, and being integrated into one card.

10. A basic function unit of voltage-source converter, comprising:
    a switching device function module,
    a by-pass function module,
    a switch protection function module;
    a secondary control and protection function module housed in a shielding box operable to reduce electromagnetic interference on the secondary control and protection function module, the secondary control and protection function module including a central logic control unit operable to coordinate functions of the switching device function module, the by-pass function module, the switch protection function module and the secondary control and protection function module;
    an energy storage unit;
    a motherboard being adapted to install on a slide rail;
    a water cooling system operable to dissipate heat, the water cooling system including a radiator operable to cool the switching device function module;
    a bursting diaphragm external to the switching device function module, the bursting diaphragm operable to protect the switching device function module from explosion;
    wherein the secondary control and protection function module, the energy storage unit and the by-pass function module are all fixed on the motherboard, and
    wherein the motherboard can move back and forth on the slide rail.

\* \* \* \* \*